US011950460B2

(12) United States Patent
Kwak et al.

(10) Patent No.: US 11,950,460 B2
(45) Date of Patent: Apr. 2, 2024

(54) DISPLAY DEVICE

(71) Applicant: SAMSUNG DISPLAY CO., LTD., Yongin-si (KR)

(72) Inventors: Nayun Kwak, Yongin-si (KR); Chulkyu Kang, Yongin-si (KR); Daesuk Kim, Yongin-si (KR); Ilgoo Youn, Yongin-si (KR); Dongsun Lee, Yongin-si (KR); Soyoung Lee, Yongin-si (KR); Jieun Lee, Yongin-si (KR); Junyoung Jo, Yongin-si (KR); Minhee Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/161,434

(22) Filed: Jan. 30, 2023

(65) Prior Publication Data

US 2023/0172013 A1    Jun. 1, 2023

Related U.S. Application Data

(63) Continuation of application No. 17/085,288, filed on Oct. 30, 2020, now Pat. No. 11,569,327.

(30) Foreign Application Priority Data

Dec. 4, 2019    (KR) .......................... 10-2019-0160007

(51) Int. Cl.
*G09G 3/3233*    (2016.01)
*H01L 27/12*    (2006.01)
(Continued)

(52) U.S. Cl.
CPC ......... *H10K 59/126* (2023.02); *G09G 3/3233* (2013.01); *H01L 27/1237* (2013.01);
(Continued)

(58) Field of Classification Search
CPC .......................... H10K 59/126; G09G 3/3233
See application file for complete search history.

(56) References Cited

U.S. PATENT DOCUMENTS 8,405,072 B2    3/2013    Jung et al.
9,391,130 B2    7/2016    Yang et al.
(Continued)

FOREIGN PATENT DOCUMENTS

EP    0795904    9/1997
EP    3232475    10/2017
(Continued)

*Primary Examiner* — Kevin M Nguyen
(74) *Attorney, Agent, or Firm* — F. CHAU & ASSOCIATES, LLC

(57) ABSTRACT

A display device includes a pixel circuit disposed on a substrate, and a display element on the pixel circuit. The pixel circuit includes a first thin-film transistor comprising a first semiconductor layer and a first gate electrode insulated from the first semiconductor layer, a second thin-film transistor comprising a second semiconductor layer and a second gate electrode insulated from the second semiconductor layer, the second semiconductor layer being connected to the first semiconductor layer and the first gate electrode, a first shielding layer overlapping the second semiconductor layer, and a second shielding layer overlapping the second semiconductor layer and stacked on the first shielding layer.

20 Claims, 15 Drawing Sheets

(51) Int. Cl.
  *H10K 59/124* (2023.01)
  *H10K 59/126* (2023.01)
  *H10K 59/131* (2023.01)

(52) U.S. Cl.
  CPC ......... *H10K 59/124* (2023.02); *H10K 59/131* (2023.02); *G09G 2300/0426* (2013.01); *G09G 2300/0819* (2013.01)

(56) References Cited

U.S. PATENT DOCUMENTS

| | | | |
|---|---|---|---|
| 10,573,703 | B2 | 2/2020 | Lee et al. |
| 11,335,757 | B2 | 5/2022 | Kim et al. |
| 2015/0060814 | A1* | 3/2015 | Noh ............... H10K 59/126 438/23 |
| 2016/0064421 | A1* | 3/2016 | Oh ................. H10K 59/126 257/43 |
| 2016/0163780 | A1* | 6/2016 | Park ............... H10K 59/126 257/40 |
| 2017/0011685 | A1 | 1/2017 | Jeon |
| 2017/0154944 | A1 | 6/2017 | Kim et al. |
| 2017/0330927 | A1 | 11/2017 | Lee et al. |
| 2018/0025203 | A1 | 1/2018 | Lee et al. |
| 2019/0081090 | A1 | 3/2019 | Lee et al. |
| 2019/0165065 | A1 | 5/2019 | Kong et al. |
| 2021/0175311 | A1 | 6/2021 | Kwak et al. |

FOREIGN PATENT DOCUMENTS

| | | |
|---|---|---|
| EP | 3309844 | 4/2018 |
| KR | 10-0674107 | 1/2007 |
| KR | 10-1270168 | 5/2013 |
| KR | 10-2016-0008681 | 1/2016 |
| KR | 10-2017-0127602 | 11/2017 |
| KR | 10-2019-0064004 | 6/2019 |
| KR | 10-2050460 | 11/2019 |

* cited by examiner

DISPLAY DEVICE

CROSS-REFERENCE TO RELATED APPLICATION

This application is a continuation of U.S. application Ser. No. 17/085,288 filed on Oct. 30, 2020 which claims priority under 35 U.S.C. § 119 to Korean Patent Application No. 10-2019-0160007, filed on Dec. 4, 2019, in the Korean Intellectual Property Office, the disclosure of which is herein incorporated by reference in its entirety.

BACKGROUND

1. Field

The present invention relates to a display device, and more particularly, to a display device including a thin-film transistor with a shielding layer.

2. Description of Related Art

In general, display devices include a display element and a driving circuit for controlling electrical signals to be applied to the display element. The driving circuit includes a thin-film transistor (TFT), a storage capacitor, and a plurality of signal lines.

To precisely control whether the display element emits light and a degree of emission of the display element, the number of TFTs to be electrically connected to one display element has increased. Thus, research into a way to solve the problem relating to high integration and power consumption of the display devices is briskly under way.

SUMMARY

One or more embodiments include a display device having enhanced display quality. However, this objective is just an example, and the scope of the present disclosure is not limited thereby.

Additional aspects will be set forth in part in the description which follows and, in part, will be apparent from the description, or may be learned by practice of the presented embodiments of the disclosure.

According to an exemplary embodiment of the present invention, a display device includes a pixel circuit disposed on a substrate, and a display element on the pixel circuit. The pixel circuit includes a first thin-film transistor comprising a first semiconductor layer and a first gate electrode insulated from the first semiconductor layer, a second thin-film transistor comprising a second semiconductor layer and a second gate electrode insulated from the second semiconductor layer, a first end of the second semiconductor layer being connected to a first end of the first semiconductor layer and a second end of the second semiconductor layer being connected to the first gate electrode, a first shielding layer overlapping the second semiconductor layer, and a second shielding layer overlapping the second semiconductor layer and stacked on the first shielding layer.

The second gate electrode includes a first sub gate electrode and a second sub gate electrode. The second semiconductor layer including a first channel area and a second channel area. The second gate electrode includes a first sub gate electrode overlapping the first channel area and a second sub gate electrode overlapping the second channel area. The second shielding layer overlaps a part between the first channel area and the second channel area.

The first sub gate electrode and the second sub gate electrode are located on the same layer.

The first shielding layer and the second shielding layer comprise the same material.

The first shielding layer and the second shielding layer comprise different materials from each other.

The pixel circuit further includes a capacitor including an upper electrode and a part of the first gate electrode as a lower electrode, and a power supply voltage line connected to the upper electrode. The upper electrode overlaps the part of the first gate electrode.

The first shielding layer, the second shielding layer and the upper electrode comprise the same material. The second shielding layer is a part of the power supply voltage line. The first shielding layer is connected to the power supply voltage line.

The first shielding layer and the upper electrode comprise the same material. The second shielding layer and the power supply voltage line comprise the same material.

The pixel circuit further includes a capacitor including an upper electrode and a part of the first gate electrode as a lower electrode, a power supply voltage line connected to the upper electrode, and a third shielding layer stacked on the second shielding layer. The second shielding layer is interposed between the first shielding layer and the third shielding layer. The upper electrode and the first shielding layer are located on the same layer. The upper electrode overlaps the part of the first gate electrode. The power supply voltage line and the second shielding layer are located on the same layer. The third shielding layer overlaps the second semiconductor layer.

The display device further includes a data line connected to the pixel circuit. The data line and the third shielding layer are located on the same layer.

The first shielding layer and the upper electrode comprises the same material. The second shielding layer and the power supply voltage line comprise the same material. The third shielding layer and the data line comprise the same material.

The third shielding layer is connected to the power supply voltage line.

According to an exemplary embodiment of the present invention, a display device includes a pixel circuit disposed on a substrate and a display element on the pixel circuit. The pixel circuit includes a thin-film transistor comprising a semiconductor layer comprising a first channel area and a second channel area, a first sub gate electrode overlapping the first channel area and a second sub gate electrode overlapping the second channel area. The pixel circuit further include a first shielding layer overlapping a part between the first channel area and the second channel area, and a second shielding layer stacked on the first shielding layer.

The first shielding layer and the second shielding layer comprise the same material.

The first shielding layer and the second shielding layer comprise different materials from each other.

The pixel circuit further includes a capacitor comprising a lower electrode and an upper electrode and a power supply voltage line is electrically connected to the upper electrode of the capacitor. The lower electrode, the first sub gate electrode and the sub second gate electrode are located on the same layer. The upper electrode overlaps the lower electrode. The first shielding layer and the upper electrode of the capacitor comprise the same material. The second shielding layer and the power supply voltage line comprises the same material.

The second shielding layer is a part of the power supply voltage line. The first shielding layer is connected to the power supply voltage line.

The pixel circuit further includes a third shielding layer located on the second shielding layer. The third shielding layer overlaps part between the first channel area and the second channel area.

The pixel circuit further includes a data line connected to the pixel circuit. The data line and the third shielding layer are located on the same layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF EXEMPLARY EMBODIMENTS

Figure 1:
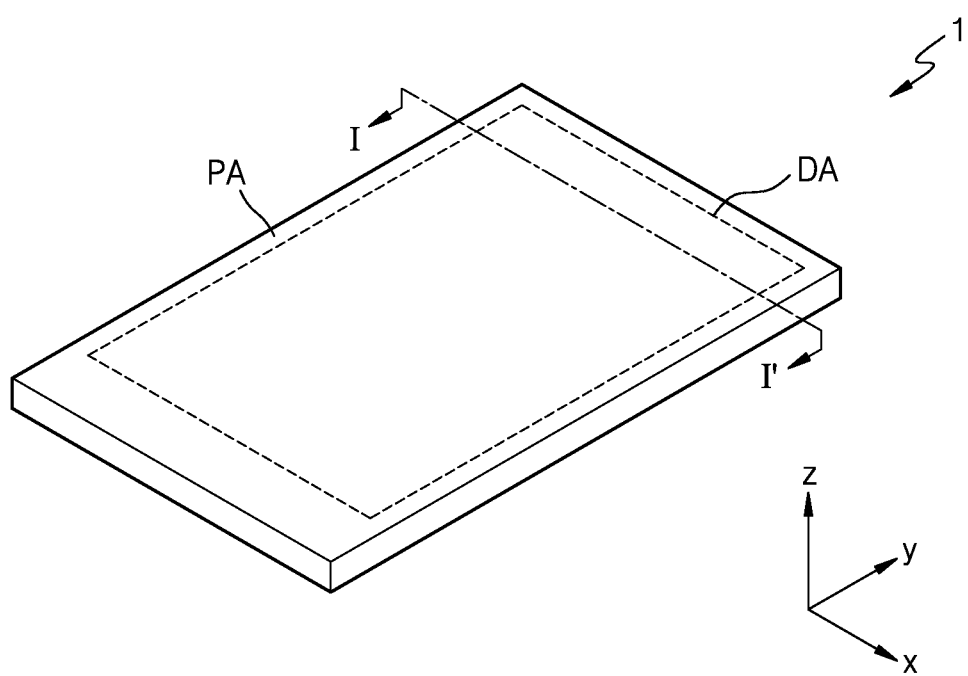
FIG. 1 is a perspective view schematically illustrating a display device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the present disclosure will be described below in more detail with reference to the accompanying drawings. Those elements that are the same or are in correspondence are rendered the same reference numeral regardless of the figure number, and a redundant description therewith is omitted.

It will be understood that although the terms "first," "second," etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it may be directly or indirectly formed on the other layer, region, or element. That is, for example, intervening layers, regions, or elements may be present.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" represents A, B, or A and B. "At least one of A and B" represents A, B, or A and B.

It will be understood that when a layer, region, or element is referred to as being "connected to," another layer, region, or element, it may be directly or indirectly connected to the other layer, region, or element. That is, for example, intervening layers, regions, or elements may be present. For example, it will be understood that when a layer, region, or element is referred to as being "electrically connected to," another layer, region, or element, it may be directly or indirectly electrically connected to the other layer, region, or element. That is, for example, intervening layers, regions, or elements may be present.

Figure 2:
FIG. 2 is a cross-sectional view schematically illustrating a display device according to an exemplary embodiment.

FIG. 1 is a perspective view schematically illustrating a display device according to an exemplary embodiment. FIG. 2 is a cross-sectional view schematically illustrating a display device according to an exemplary embodiment, which corresponds to a cross-section cut along line I-I' of FIG. 1.

A display device according to one or more exemplary embodiments may be implemented with an electronic device, such as a smartphone, a mobile phone, a smart watch, a navigation device, a game console, a television (TV), a head unit for a vehicle, a notebook computer, a laptop computer, a tablet computer, a personal media player (PMP), or a personal digital assistant (PDA). Also, the electronic device may be a flexible device.

A display device 1 may include a display area DA, in which an image is displayed, and a peripheral area PA around the display area DA. The display device 1 may provide a certain image using light emitted from a plurality of pixels arranged in the display area DA.

In a plane view of the display area DA, the display area DA may have a rectangular shape, as shown in FIG. 1. The present invention is not limited thereto. In an exemplary embodiment, the display area DA may have a polygonal shape, such as a triangular, pentagonal, or hexagonal shape, or an atypical shape, such as a circular or an oval shape.

The peripheral area PA around the display area DA may be a kind of non-display area in which no pixels are arranged. In an exemplary embodiment, the peripheral area PA may be a pixel-free area. The display area DA may be entirely surrounded by the peripheral area PA. A variety of signal lines for providing electrical signals to the display area DA and pads to which a printed circuit board (PCB) or a driver integrated circuit (IC) chip is to be attached, may be arranged in the peripheral area PA.

Hereinafter, an organic light-emitting display device will be described as an example of the display device 1 according to an exemplary embodiment. However, a display device according to the present disclosure is not limited thereto. In an exemplary embodiment, examples of the display device 1 according to the present disclosure may include an inorganic light-emitting display device, an inorganic electroluminescence (EL) display device, or a quantum dot light-emitting display device.

Referring to FIG. 2, the display device 1 may include a display panel 10, an input sensing layer 40 located on the display panel 10, an optical functional layer 50, and a window 60. The window 60 may cover the optical functional layer 50.

The display panel 10 may display an image. The display panel 10 includes pixels arranged in the display area DA. The pixels may include a display element. The display element may be connected to a pixel circuit. The display element may include an organic light-emitting diode or a quantum organic light-emitting diode.

The input sensing layer 40 may be configured to obtain coordinate information according to an external input, for example, a touch event. The input sensing layer 40 may include a sensing electrode or touch electrode and trace lines connected to the sensing electrode. The input sensing layer 40 may be located on the display panel 10. The input sensing layer 40 may be configured to sense an external input by using a mutual capacitance method and/or a self-capacitance method.

The input sensing layer 40 may be formed directly on the display panel 10 or may be formed separately from the display panel 10 and then may be coupled to the display panel 10 by using an adhesive layer, such as an optical clear adhesive. For example, the input sensing layer 40 may be consecutively formed after a process of forming the display panel 10 is performed. In this case, the input sensing layer 40 may be part of the display panel 10, and no adhesive layer may be between the input sensing layer 40 and the display panel 10. In FIG. 2, the input sensing layer 40 is between the display panel 10 and the optical functional layer 50. However, the present invention is not limited thereto. In an exemplary embodiment, the input sensing layer 40 may be located on the optical functional layer 50.

The optical functional layer 50 may include an antireflective layer. The antireflective layer may be configured to reduce reflectivity of light (external light) incident onto the display panel 10 from the outside through the window 60. The antireflective layer may include a phase retarder and a polarizer. The phase retarder may be of a film type or liquid crystal coating type and may include a λ/2 phase retarder and/or a λ/4 phase retarder. The polarizer may also be of a film type or liquid crystal coating type. The film type may include an elongation-type synthetic resin film, and the liquid crystal coating type may include liquid crystals arranged in a certain arrangement. The phase retarder and the polarizer may further include a protective film. The phase retarder and the polarizer itself or the protective film may be defined as a base layer for the antireflective layer.

In an exemplary embodiment, the antireflective layer may include a black matrix and color filters. The color filters may be arranged considering colors of light emitted from each of the pixels of the display panel 10. In another embodiment, the antireflective layer may include a destructive interference structure. The destructive interference structure may include a first reflective layer and a second reflective layer, which are located on different layers. First reflected light and second reflected light reflected from the first reflective layer and the second reflective layer, respectively, may destructively interfere. Thus, the reflectivity of external light may be reduced.

The optical functional layer 50 may include a lens layer. The lens layer may be configured to increase emission efficiency of light emitted from the display panel 10 or to reduce color deviation. The lens layer may include a layer having a concave or convex lens shape or/and a plurality of layers having different refractive indices. The optical functional layer 50 may include both the antireflective layer and the lens layer described above or one thereof.

In an exemplary embodiment, the optical functional layer 50 may be consecutively formed after a process of forming the display panel 10 and/or the input sensing layer 40 is performed. In this case, no adhesive layer may be between the optical functional layer 50 and the display panel 10 and/or the input sensing layer 40.

Figure 3:
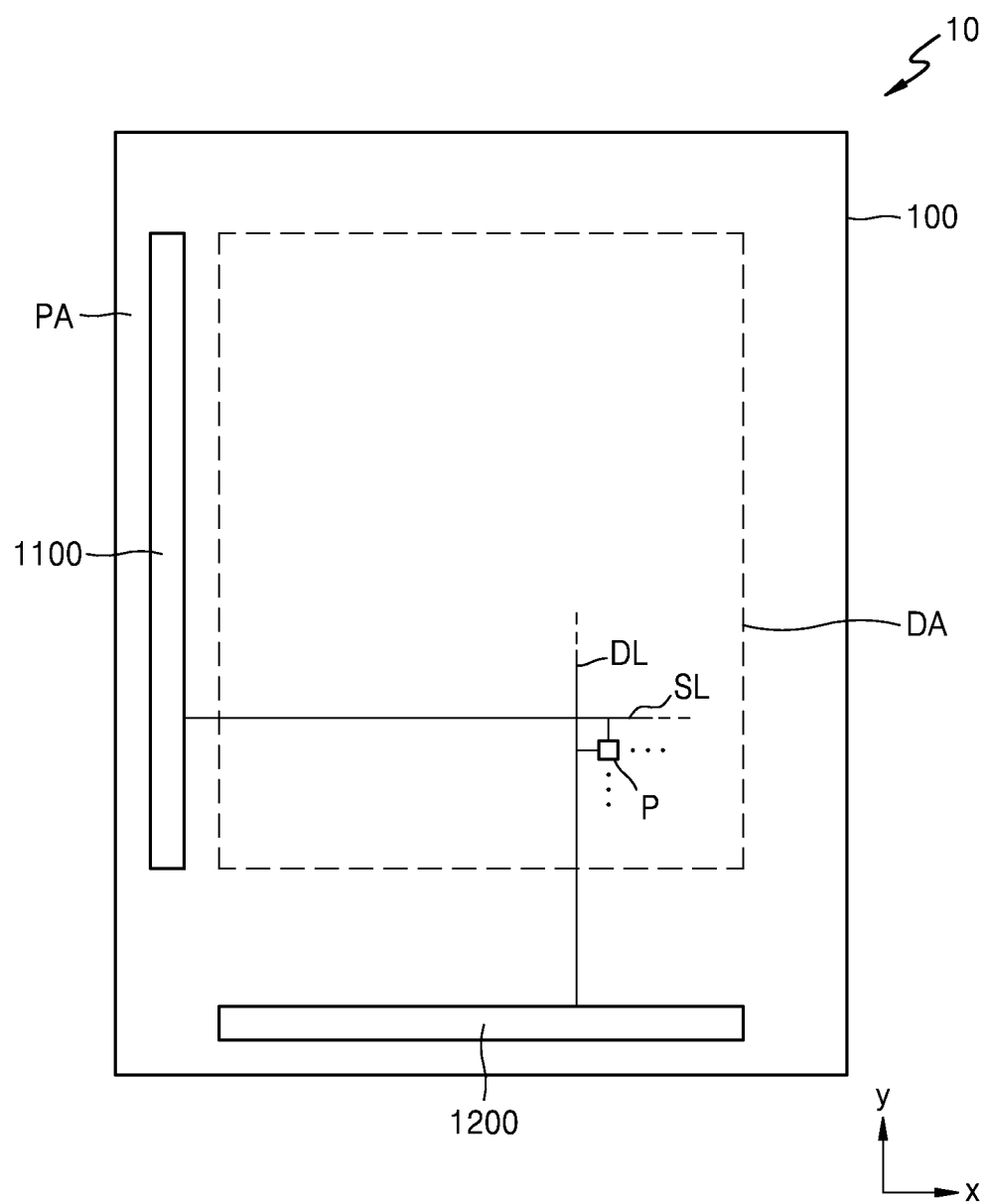
FIG. 3 is a plan view schematically illustrating a display panel according to an exemplary embodiment.
Figure 4:
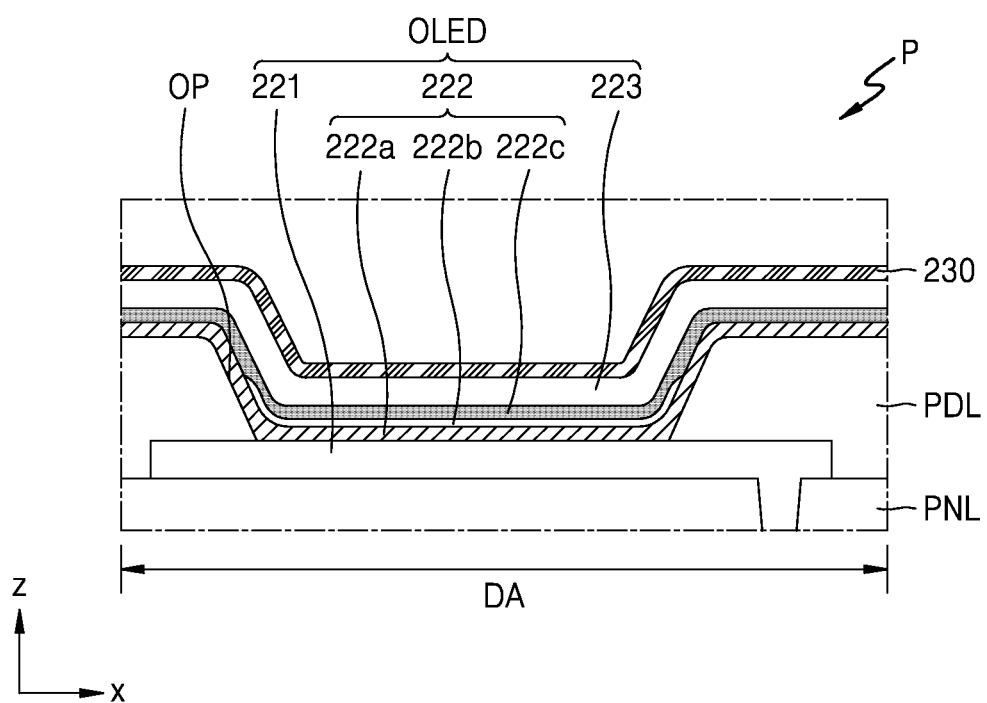
FIG. 4 is a cross-sectional view schematically illustrating one pixel of a display panel according to an exemplary embodiment.

FIG. 3 is a plan view schematically illustrating a display panel according to an exemplary embodiment. FIG. 4 is a cross-sectional view schematically illustrating one pixel of a display panel according to an exemplary embodiment. For convenience of description and clarity of drawings, a thin film encapsulation layer that is an encapsulation member is omitted in FIG. 4.

Referring to FIG. 3, the display panel 10 may include a display area DA and a peripheral area PA. FIG. 3 illustrates a substrate 100 of the display panel 10. For example, the substrate 100 may have a first region corresponding to the display area DA and a second region corresponding to the peripheral area PA.

The substrate 100 may include various materials, such as glass, metal, or plastic. In an embodiment, the substrate 100 may include a flexible material. Here, the flexible material refers to a substrate that is bendable, foldable, or rollable. The substrate 100 made of the flexible material may include ultra-thin glass, metal, or plastic.

The display panel 10 includes a plurality of pixels P arranged in the display area DA. Each of the pixels P may include an organic light-emitting diode OLED that is a display element, as shown in FIG. 4. The organic light-emitting diode OLED may be connected to a pixel circuit. The pixel circuit may include a plurality of transistors and a capacitor. Each of the pixels P may emit red, green, blue, or white light, for example, from the organic light-emitting diode OLED.

The organic light-emitting diode OLED may include a pixel electrode 221, an opposite electrode 223 spaced apart from the pixel electrode 221, and an intermediate layer 222 between the pixel electrode 221 and the opposite electrode 223.

The pixel electrode 221 is located on a planarization layer PNL. The pixel electrode 221 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). In an exemplary embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an exemplary embodiment, the pixel electrode 221 may further include a layer including ITO, IZO, ZnO, or In$_2$O$_3$ on/under the above-described reflective layer.

A pixel-defining layer PDL may be formed on the pixel electrode 221. The pixel-defining layer PDL may include an opening OP for exposing a top surface of the pixel electrode 221 and may cover edges of the pixel electrode 221. For example, the opening OP may extend through the pixel-defining layer PDL to expose the top surface of the pixel electrode 221. The pixel-defining layer PDL may include an organic insulating material. In an exemplary embodiment, the pixel-defining layer PDL may include an organic insulating material or an inorganic insulating material. An emission area may be defined by the opening OP of the pixel-defining layer PDL. The emission area may be an area in which an emission layer 222b is located.

The intermediate layer 222 may include the emission layer 222b. The intermediate layer 222 may further include a first functional layer 222a under the emission layer 222b and/or a second functional layer 222c on the emission layer 222b. The emission layer 222b may include a polymer or small molecular weight organic material that emits light of a certain color.

The first functional layer 222a may have a single layer or multi-layer structure. For example, when the first functional layer 222a includes a polymer material, the first functional layer 222a that is a hole transport layer (HTL) having a single layer structure may include poly-(3,4)-ethylene-dihydroxy thiophene (PEDOT) or polyaniline (PANI). When the first functional layer 222a includes a small molecular weight material, the first functional layer 222a may include a hole injection layer (HIL) and an HTL.

The second functional layer 222c may be omitted. For example, when the first functional layer 222a and the emission layer 222b include a polymer material, the second functional layer 222c may be formed. The second functional layer 222c may have a single layer or multi-layer structure. The second functional layer 222c may include an electron transport layer (ETL) and/or an electron injection layer (EIL).

The emission layer 222b of the intermediate layer 222 may be located in each pixel. For example, the emission layer 222b may be patterned so as to correspond to the pixel electrode 221. Each of the first functional layer 222a and the second functional layer 222c of the intermediate layer 222, unlike in the emission layer 222b, may be formed as a single body so as to correspond to the plurality of pixels P.

The opposite electrode 223 may include a conductive material having a small work function. For example, the opposite electrode 223 may include a (semi-)transparent layer including Ag, Mg, Al, Pt, Pd, Au, Ni, Nd, Ir, Cr, lithium (Li), calcium (Ca), or an alloy thereof. In an exemplary embodiment, the opposite electrode 223 may further include a layer, such as ITO, IZO, ZnO, or In$_2$O$_3$, on the (semi-)transparent layer including the above-described materials.

A capping layer 230 may be located on the opposite electrode 223. For example, the capping layer 230 may include lithium fluoride (LiF) and may be formed by using thermal deposition. In some exemplary embodiments, the capping layer 230 may be omitted.

A scan driver 1100 for providing a scan signal to the pixel circuit connected to each pixel P, a data driver 1200 for providing a data signal to the pixel circuit connected to each pixel P, and main power supply lines (not shown) for providing a first power supply voltage and a second power supply voltage may be arranged in the peripheral area PA. In FIG. 3, the data driver 1200 is adjacent to one side of the substrate 100. However, the present invention is not limited thereto. In an exemplary embodiment, the data driver 1200 may be arranged on a flexible printed circuit board (FPCB) electrically connected to a pad arranged at one side of the display panel 10.

Figure 5:
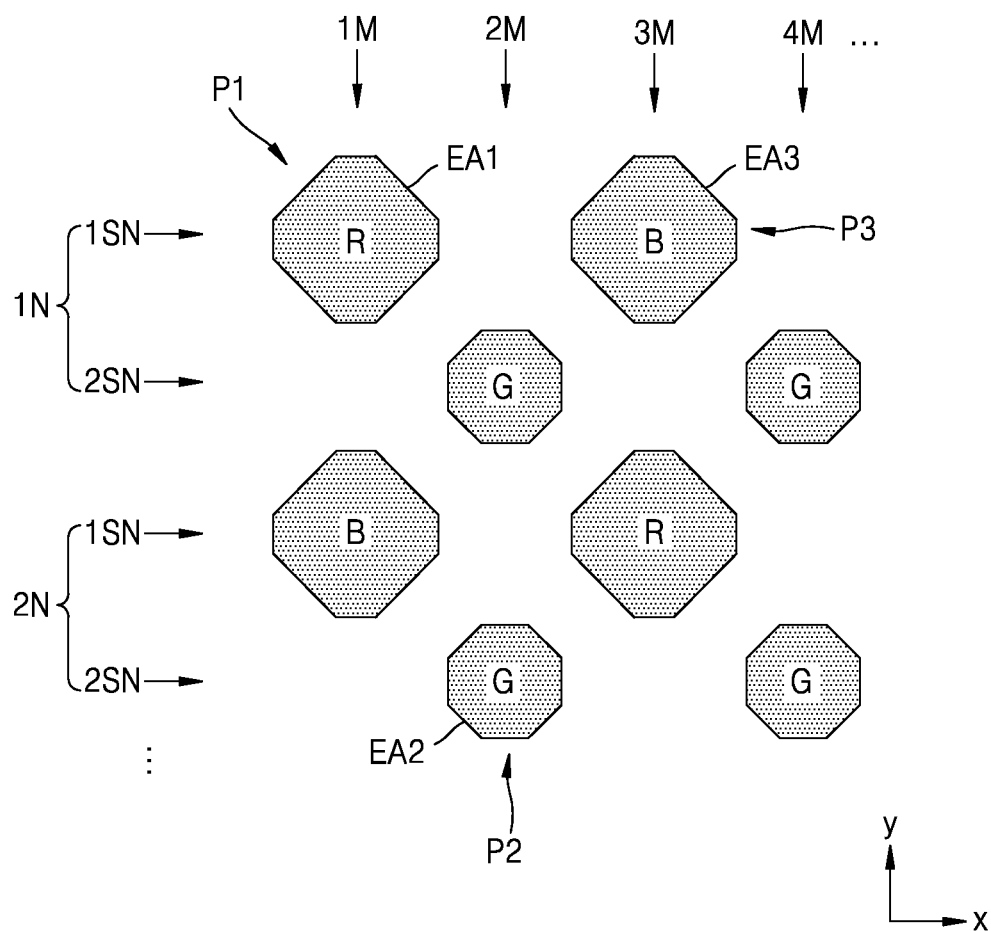
FIG. 5 is a schematic layout diagram of a plurality of pixels of a display device according to an exemplary embodiment.

FIG. 5 is a schematic layout diagram of a plurality of pixels in a display area of a display device according to an exemplary embodiment. The arrangement of pixels shown in FIG. 5 may correspond to the arrangement of a plurality of pixels in an emission area. The emission area may be an area in which as shown in FIG. 4, an emission layer 222b is located.

The display area DA may include a first pixel P1, a second pixel P2, and a third pixel P3, for example. The first pixel P1, the second pixel P2, and the third pixel P3 may be repeatedly arranged in an x-direction (a first direction) and a y-direction (a second direction) according to certain patterns in the display area DA. Each of the first pixel P1, the second pixel P2, and the third pixel P3 may include an organic light-emitting diode OLED. The organic light-emitting diode OLED of each pixel may be arranged on an upper layer of a pixel circuit. The organic light-emitting diode OLED may be located directly on an upper portion of the pixel circuit to overlap the pixel circuit or may be offset with the pixel circuit to overlap part of a pixel circuit of another pixel arranged in an adjacent row or column.

The first pixel P1 may include a first emission area EA1, the second pixel P2 may include a second emission area EA2, and a third pixel P3 may include a third emission area EA3. An emission area of a pixel that is an area in which an emission layer is located, may be defined by an opening of a pixel-defining layer, as shown in FIG. 4.

The first emission area EA1 of the first pixel P1 and the third emission area EA3 of the third pixel P3 may be alternately arranged in odd columns in the y-direction. The second emission area EA2 of the second pixel P2 may be repeatedly arranged in even columns in the y-direction. In FIG. 5, it is assumed for the convenience of description that pixels are arranged in four columns 1M to 4M and two rows 1N and 2N. The arrangements of the pixels in the display area DA will be described with reference to the four columns 1M to 4M and the two rows 1N and 2N. For example, the first emission area EA1 of the first pixel P1 and the third emission area EA3 of the third pixel P3 may be alternately arranged in a first column 1M and a third column 3M in the y-direction. The second emission area EA2 of the second pixel P2 may be repeatedly arranged in a second column 2M and a fourth column 4M. The second column 2M is between the first row 1M and the third column 3M. The third column 3M is between the second column 2M and the fourth column 4M. The arrangement of the first emission area EA1 of the first pixel P1 and the third emission area EA3 of the third pixel P3 in the first column 1M may be opposed to the arrangement of the first emission area EA1 of the first pixel P1 and the third emission area EA3 of the third pixel P3 in the third column 3M.

The first emission area EA1 of the first pixel P1 and the third emission area EA3 of the third pixel P3 may be alternately arranged in a first sub-row 1SN of each of rows 1N and 2N in the x-direction, and the second emission area EA2 of the second pixel P2 may be repeatedly arranged in a second sub-row 2SN of each of the rows 1N and 2N in the x-direction. For example, the first emission area EA1 of the first pixel P1, the second emission area EA2 of the second pixel P2, the third emission area EA3 of the third pixel P3, and the second emission area EA2 of the second pixel P2 may be repeatedly arranged in each of the rows 1N and 2N in a zigzag manner.

The first emission area EA1 of the first pixel P1, the second emission area EA2 of the second pixel P2, and the third emission area EA3 of the third pixel P3 may have different areas. In an exemplary embodiment, the third emission area EA3 of the third pixel P3 may have a greater area than that of the first emission area EA1 of the first pixel P1. Also, the third emission area EA3 of the third pixel P3 may have a greater area than that of the second emission area EA2 of the second pixel P2. The first emission area EA1 of the first pixel P1 may have a greater area than that of the second emission area EA2 of the second pixel P2. However, the present invention is not limited thereto. In an exemplary embodiment, the third emission area EA3 of the third pixel P3 may have the same area as that of the first emission area EA1 of the first pixel P1, and each of the first emission area EA1 and the third emission area EA3 may have an area greater than that of the second emission area EA2. In an exemplary embodiment, the first emission area EA1 of the first pixel P1 may have a greater area than that of the second emission area EA2 of the second pixel P2 and that of the third emission area EA3 of the third pixel P3.

The first through third emission areas EA1, EA2, and EA3 may have a polygonal shape, such as a rectangular or octagonal shape, a circular shape, or an oval shape. The polygonal shape may also include a vertex-rounded shape.

In an exemplary embodiment, as shown in FIG. 5, the first pixel P1 may be a red pixel R that emits red light, the second pixel P2 may be a green pixel G that emits green light, and the third pixel P3 may be a blue pixel B that emits blue light. In an exemplary embodiment, the first pixel P1 may be a red pixel R, the second pixel P2 may be a blue pixel B, and the third pixel P3 may be a green pixel G.

A pixel arrangement according to an exemplary embodiment is not limited to the arrangement described above. For example, the present disclosure may be applied to a pixel arrangement having a stripe arrangement, a mosaic arrangement, or a delta arrangement. Also, the present disclosure may also be applied to a pixel arrangement structure further including a white pixel for emitting white light.

Figure 6:
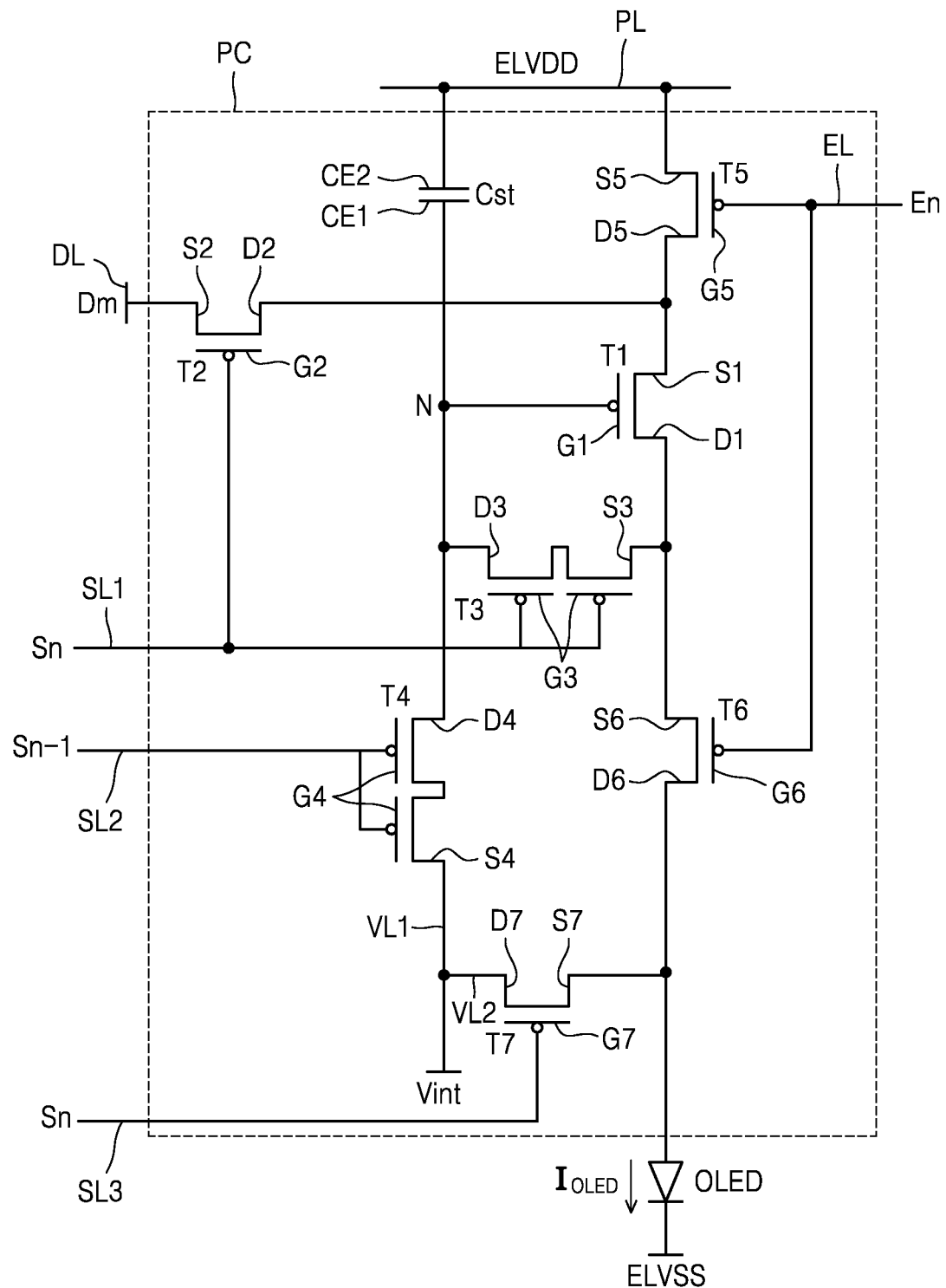
FIG. 6 is an equivalent circuit diagram schematically illustrating a pixel circuit of one pixel of a display panel according to an exemplary embodiment.

FIG. 6 is a circuit diagram schematically illustrating a pixel circuit of one pixel of a display panel according to an exemplary embodiment.

Referring to FIG. 6, a pixel circuit PC of a pixel P may include a plurality of first through seventh transistors T1 through T7 and a capacitor Cst. The first through seventh transistors T1 through T7 may be implemented with thin-film transistors.

The pixel P may be connected to a first scan line SL1 for delivering a scan signal Sn, a second scan line SL2 for delivering the previous scan signal Sn−1, a third scan line SL3 for delivering the scan signal Sn, an emission control line EL for delivering an emission control signal En, and a data line DL for delivering a data signal Dm. The first scan line SL1 and the third scan line SL3 may be electrically connected to each other, and the same scan signal Sn may be applied to the first scan line SL1 and the third scan line SL3.

The power supply voltage line PL may be configured to deliver a first power supply voltage ELVDD to the first transistor T1. A first initialization voltage line VL1 may be configured to deliver an initialization voltage Vint to the first transistor T1. A second initialization voltage line VL2 may be configured to deliver the initialization voltage Vint to the seventh transistor T7.

The first scan line SL1, the second scan line SL2, the third scan line SL3, the emission control line EL, and the first and second initialization voltage lines VL1 and VL2 may extend in the x-direction and may be spaced apart from one another in the y-direction. The data line DL and the power supply voltage line PL may extend in the y-direction and may be spaced apart from each other in the x-direction.

The pixel circuit PC may include a plurality of first through seventh transistors T1 through T7 and a capacitor Cst. The x-direction and the y-direction refer to directions in a layout of the pixel circuit PC which will be described with reference to FIGS. 8, and 9A and 9B.

The first transistor T1 includes a gate electrode G1, a source electrode S1 connected to the power supply voltage line PL via the fifth transistor T5, and a drain electrode D1 electrically connected to a pixel electrode of the organic light-emitting diode OLED via the sixth transistor T6. The gate electrode G1 of the first transistor T1 is connected to a lower electrode CE1 of the capacitor Cst, a drain electrode D3 of the third transistor T3, and a drain electrode D4 of the fourth transistor T4 at a node N. The first transistor T1 functions as a driving transistor, receives the data signal Dm according to a switching operation of the second transistor T2, and supplies a current to the organic light-emitting diode OLED.

The second transistor T2 (a switching transistor) includes a gate electrode G2 connected to the first scan line SL1, a source electrode S2 connected to the data line DL, and a drain electrode D2 connected to the source electrode S1 of the first transistor T1. The second transistor T2 is turned on according to the scan signal Sn transmitted via the first scan line SL1 and performs a switching operation of delivering the data signal Dm delivered to the data line DL to the source electrode S1 of the first transistor T1.

The third transistor T3 (a compensation transistor) includes a gate electrode G3 connected to the first scan line SL1, a source electrode S3 connected to the drain electrode D1 of the first transistor T1, and a drain electrode D3 connected to the lower electrode CE1 of the capacitor Cst, the drain electrode D4 of the fourth transistor T4, and the gate electrode G1 of the first transistor T1. The source electrode S3 of the third transistor T3 is connected to the pixel electrode of the organic light-emitting diode OLED via the sixth transistor T6. The third transistor T3 is turned on according to the scan signal Sn delivered via the first scan line SL1 and diode-connects the first transistor T1. The third transistor T3 compensates a threshold voltage of the first transistor T1.

The fourth transistor T4 (a first initialization transistor) includes a gate electrode G4 connected to the second scan line SL2, a source electrode S4 connected to the first initialization voltage line VL1, and a drain electrode D4 connected to the lower electrode CE1 of the capacitor Cst, the drain electrode D3 of the third transistor T3, and the gate electrode G1 of the first transistor T1. The fourth transistor T4 is turned on according to the previous scan line Sn−1 delivered via the second scan line SL2 and delivers the initialization voltage Vint to the gate electrode G1 of the first transistor T1, thereby initializing a gate voltage of the first transistor T1.

The fifth transistor T5 (a first emission control transistor) includes a gate electrode G5 connected to the emission control line EL, a source electrode S5 connected to the power supply voltage line PL, and a drain electrode D5 connected to the source electrode S1 of the first transistor T1 and the drain electrode D2 of the second transistor T2.

The sixth transistor T6 (a second emission control transistor) includes a gate electrode G6 connected to the emission control line EL, a source electrode S6 connected to the drain electrode D1 of the first transistor T1 and the source electrode S3 of the third transistor T3, and a drain electrode D6 connected to the pixel electrode of the organic light-emitting diode OLED.

The fifth transistor T5 and the sixth transistor T6 are simultaneously turned on according to the emission control signal En delivered via the emission control line EL such that current may flow through the organic light-emitting diode OLED.

The seventh transistor T7 (a second initialization transistor) includes a gate electrode G7 connected to the third scan line SL3, a source electrode S7 connected to the drain electrode D6 of the sixth transistor T6 and the pixel electrode of the organic light-emitting diode OLED, and a drain electrode D7 connected to the second initialization voltage line VL2. The seventh transistor T7 is turned on according to the scan signal Sn delivered via the third scan line SL3 and delivers the initialization voltage Vint to the pixel electrode of the organic light-emitting diode OLED, thereby initializing the pixel electrode of the organic light-emitting diode OLED. The seventh transistor T7 may be omitted.

The capacitor Cst may include the lower electrode CE1 connected to the gate electrode G1 of the first transistor T1 and an upper electrode CE2 connected to the power supply voltage line PL. The lower electrode CE1 of the capacitor Cst is also connected to the drain electrode D3 of the third transistor T3 and the drain electrode D4 of the fourth transistor T4.

The organic light-emitting diode OLED may include the pixel electrode, an opposite electrode, and an emission layer between the pixel electrode and the opposite electrode. A second power supply voltage ELVSS may be applied to the opposite electrode. The organic light-emitting diode OLED may receive a driving current IDLED from the first transistor T1 to emit light and to display an image.

In an embodiment, locations of a source electrode and a drain electrode of each of the first through seventh transistors T1 through T7 may be changed according to the type (a p-type or an n-type) of a transistor and/or operation conditions thereof. The transistors of FIG. 6 are p-type metal-oxide-semiconductor (MOS) transistors. The present invention is not limited thereto. In an exemplary embodiment, the transistors of FIG. 6 may be n-type MOS transistors.

In FIG. 6, the third transistor T3 may include a dual gate electrode such that two transistors may be connected in series. Similarly, the fourth transistor T4 may include a dual gate electrode such that two transistors may be connected in series. In an exemplary embodiment, the third transistor T3 including two sub-transistors connected in series may have a reduced channel capacitance to have a faster high frequency response and lower power consumption as compared to a single transistor.

FIGS. 7A through 7D respectively illustrate a cross-sectional view schematically illustrating a thin-film transistor according to an exemplary embodiment. FIGS. 7A through 7D respectively are a cross-sectional view of a third transistor T3 of FIG. 6. In an exemplary embodiment, the third transistor T3 may have the same configuration as the fourth transistor T4. Hereinafter, the third transistor T3 will be described as an example, and this may also be applied to the fourth transistor T4.

Figure 7A:
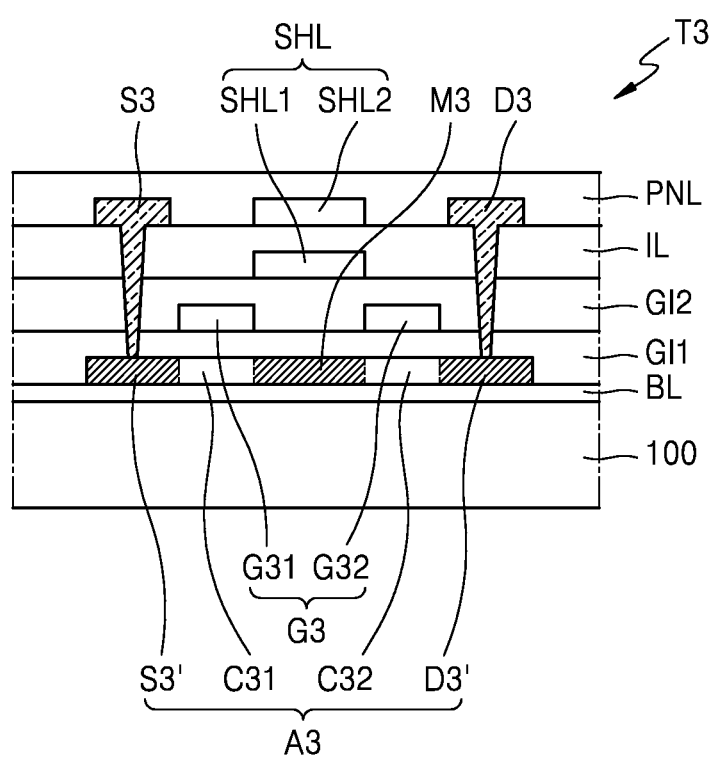
FIGS. 7A through 7D are cross-sectional views schematically illustrating a thin-film transistor according to an exemplary embodiment.

Referring to FIG. 7A, the third thin-film transistor T3 may include a semiconductor layer A3, a gate electrode G3 on the semiconductor layer A3 and insulated from the semiconductor layer A3, a source electrode S3, and a drain electrode D3.

A buffer layer BL may be located on the substrate 100, and the semiconductor layer A3 of the third transistor T3 may be located on the buffer layer BL.

The semiconductor layer A3 may include a first channel area C31, a second channel area C32, a source area S3', a drain area D3', and a middle area M3. The semiconductor layer A3 may include polysilicon. In an exemplary embodiment, the semiconductor layer A3 may include amorphous silicon, oxide semiconductor, or organic semiconductor, and the like. The third thin-film transistor T3 includes two channel areas of the first channel area C31 and the second channel area C32 separated by the middle area M.

The gate electrode G3 may include a first gate electrode G31 that overlaps the first channel area C31 and a second gate electrode G32 that overlaps the second channel area C32. The gate electrode G3 may include low resistance metal materials. The gate electrode G3 may include conductive materials including molybdenum (Mo), aluminum (Al), copper (Cu), or titanium (Ti), and may have a multi-layer or single layer structure including the materials described above. A first gate insulating layer Gi1 may be between the semiconductor layer A3 and the gate electrode G3. The first gate electrode G31 and the second gate electrode G3 are connected to the first scan line SL1, and thus receive the same signal of the scan signal Sn delivered via the first scan line SL1.

The source electrode S3 and the drain electrode D3 may be electrically connected to the source area S3' and the drain area D3' of the semiconductor layer A3, respectively. In an exemplary embodiment, the third transistor T3 includes a first sub-transistor T3-1 and a second sub-transistor T3-2 connected in series thereto. The first sub-transistor T3-1 includes the first gate electrode G31, the first channel area C31, the source area S3' and the middle area M. The second sub-transistor T3-2 includes the second gate electrode G32, the second channel area C32, the drain area D3' and the middle area M. The first sub-transistor T3-1 and the second sub-transistor T3-2 are connected in series to each other via the middle area M shared by the two sub-transistors T3-1 and T3-2. In the first sub-transistor T3-1, the middle area M serves as a drain area, and in the second sub-transistor T3-2, the middle area M serves as a source area. The middle area may be also referred to as a common source-drain area.

The source electrode S3 and the drain electrode D3 may include materials having good conductivity. The source electrode S3 and the drain electrode D3 may include conductive materials including Mo, Al, Cu, or Ti, and may have a multi-layer or single layer structure including the materials described above. In an exemplary embodiment, the source electrode S3 and the drain electrode D3 may have a multi-layer structure including Ti/Al/Ti. A second gate insulating layer GI2 and an interlayer insulating layer IL may be between the gate electrode G3 and the source electrode S3 and between the gate electrode G3 and the drain electrode D3. In an exemplary embodiment, the second gate insulating layer GI2 may cover the gate electrode G3, and the interlayer insulating layer IL may be disposed on the second gate insulating layer GI2.

Each of the first gate insulating layer GI1, the second gate insulating layer GI2, and the interlayer insulating layer IL may include inorganic insulating materials, such as silicon oxide, silicon nitride, silicon oxynitride, aluminum oxide, titanium oxide, tantalum oxide, and hafnium oxide. The first gate insulating layer GI1, the second gate insulating layer GI2, and the interlayer insulating layer IL may have a single layer or multi-layer structure including the materials described above.

A planarization layer PNL may be located on the source electrode S3 and the drain electrode D3. For example, the planarization layer PNL may be disposed on the interlayer insulating layer IL, covering the source electrode S3 and the drain electrode D3.

A shielding layer SHL may overlap a source area and/or a drain area (i.e., the middle area or the common source-drain area which is a part between the first channel area and the second channel area) of the semiconductor layer A3. In an exemplary embodiment, the shielding layer SHL may overlap the common source-drain area that is not covered by an upper electrode layer. For example, unlike the source area S3' and the drain area D3' connected to the source electrode S3 and the drain electrode D3 respectively, the common source-drain area has no corresponding electrode connected thereto. At least part of the shielding layer SHL may overlap the common source-drain area that is not covered by the source electrode S3, the drain electrode D3, and the gate electrode G3 of the semiconductor layer A3. For example, as shown in FIG. 7A, the shielding layer SHL may overlap the middle area M3 (i.e., the common source-drain area) between the first channel area C31 and the second channel area C32. The middle area M3 that serves both as the source area of the second sub-transistor T3-2 and the drain area of the first sub-transistor T3-1, may be doped with an impurity. For example, the middle area M3 may be an area including a drain area adjacent to the first channel area C31 and a source area adjacent to the second channel area C32.

The shielding layer SHL may include at least two layers located on different layers. Each of the different shielding layers SHL may overlap at least part of the middle area M3. At least part of the different shielding layers SHL may overlap each other. Part of the different shielding layers SHL may include different materials, and the other part thereof may include the same materials.

In an exemplary embodiment, the shielding layers SHL may overlap an area between two channel areas of a thin-film transistor including a dual gate electrode, i.e., the middle area M3 of the semiconductor layer A3. Thus, an area exposed by light that may be applied from an upper portion of the substrate 100 is minimized, such that damage of the semiconductor layer A3 may be minimized or prevented.

Also, in an exemplary embodiment of the present disclosure, the shielding layers SHL may be arranged in a multi-layer structure such that the exposed area of the source area and the drain area of the semiconductor layer is minimized and thus the thin-film transistor may be robustly protected from external light.

In an exemplary embodiment, as shown in FIG. 7A, the shielding layers SHL may include a first shielding layer SHL1 and a second shielding layer SHL2. The first shielding layer SHL1 may be between the second gate insulating layer GI2 and the interlayer insulating layer IL. The second shielding layer SHL2 may be located on the interlayer insulating layer IL. The planarization layer PNL may be located on the second shielding layer SHL2, covering the second shielding layer SHL2.

The first shielding layer SHL1 and the second shielding layer SHL2 may include different materials. For example, the first shielding layer SHL1 may include the same materials as materials for forming the upper electrode CE2 of the capacitor Cst, and the second shielding layer SHL2 may include the same materials as materials for forming the source electrode S3 and the drain electrode D3.

Figure 7B:
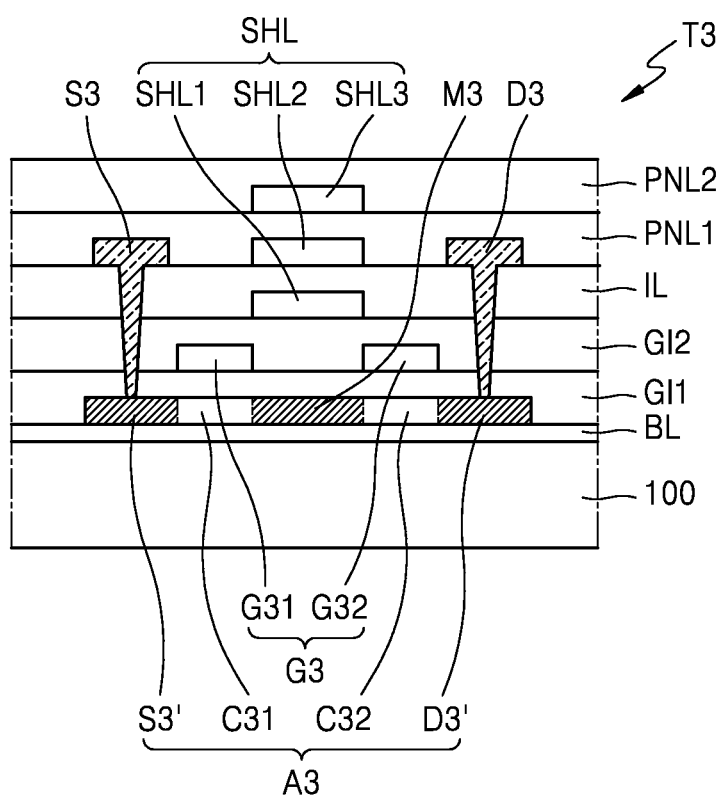

In an exemplary embodiment, as shown in FIG. 7B, the shielding layers SHL may further include a third shielding layer SHL3 in addition to the first shielding layer SHL1 and the second shielding layer SHL2. The first shielding layer SHL1 may be between the second gate insulating layer GI2 and the interlayer insulating layer IL, the second shielding layer SHL2 may be between the interlayer insulating layer IL and a first planarization layer PNL1, and the third shielding layer SHL3 may be between the first planarization layer PNL1 and a second planarization layer PNL2.

The third shielding layer SHL3 may include the same materials as materials for forming the first shielding layer SHL1 or the second shielding layer SHL2. The third shielding layer SHL3 may include different materials from the materials for forming the first shielding layer SHL1 or the second shielding layer SHL2.

Figure 7C:
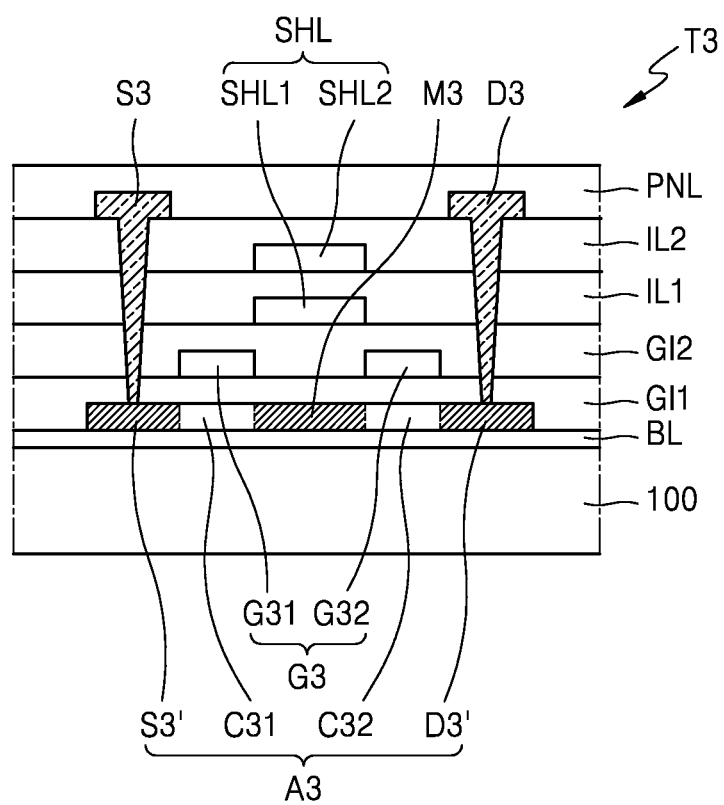

FIG. 7C illustrates an example in which the second gate insulating layer GI2 and two interlayer insulating layers including a first interlayer insulating layer IL1 and a second interlayer insulating layer IL2 are arranged between the gate electrode G3, the source electrode S3 and the drain electrode D3. The shielding layer SHL may include the first shielding layer SHL1 and the second shielding layer SHL2, and the first shielding layer SHL1 and the second shielding layer SHL2 may include the same materials. For example, the first shielding layer SHL1 and the second shielding layer SHL2 may include the same materials as materials for forming the upper electrode CE2 of the capacitor Cst. The first shielding layer SHL1 and the second shielding layer SHL2 may also include different materials.

Figure 7D:
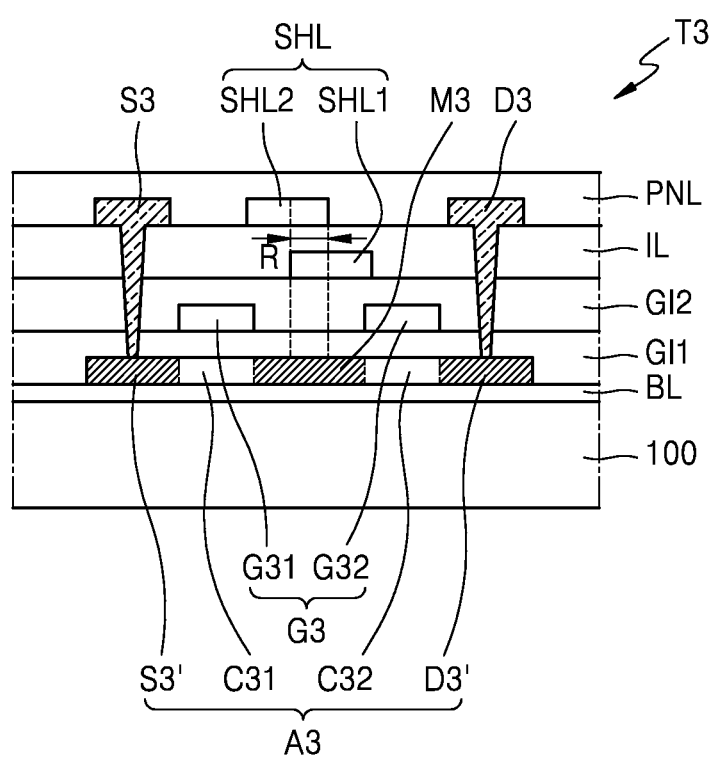

In embodiments of FIGS. 7A through 7C, each of the first shielding layer SHL1 and the second shielding layer SHL2 overlaps the middle area M3 of the semiconductor layer A3 entirely. However, the present invention is not limited thereto. In an exemplary embodiment, as shown in FIG. 7D, each of the first shielding layer SHL1 and the second shielding layer SHL2 may overlap part of the middle area M3 of the semiconductor layer A3. The first shielding layer SHL1 and the second shielding layer SHL2 are offset. Thus, a portion in which the first shielding layer SHL1 overlaps the middle area M3 of the semiconductor layer A3 may be different from a portion in which the second shielding layer SHL2 overlaps the middle area M3 of the semiconductor layer A3. The second shielding layer SHL2 may overlap a partial region R of the first shielding layer SHL1.

Although not shown, in an exemplary embodiment of FIG. 7D, a third shielding layer SHL3 may be further located on the first shielding layer SHL1 and the second shielding layer SHL2, as shown in FIG. 7B. The third shielding layer SHL3 may be offset with the first shielding layer SHL1 and/or the second shielding layer SHL2 and thus may overlap part of the first shielding layer SHL1 and/or the second shielding layer SHL2. The present invention is not limited thereto. In an exemplary embodiment, the third shielding layer SHL3 may overlap the first shielding layer SHL1 and the second shielding layer SHL2 entirely.

In FIGS. 7A through 7D, the first shielding layer SHL1, the second shielding layer SHL2, and the third shielding layer SHL3 may be electrically connected to a line having a constant voltage and thus the constant voltage may be applied to the first shielding layer SHL1, the second shielding layer SHL2, and the third shielding layer SHL3.

In FIGS. 7A through 7D, the source electrode S3 and the drain electrode D3, which are respectively connected to the source area S3' and the drain area D3' of the third thin-film transistor T3, have been described. In some exemplary embodiments, the source area S3' and the drain area D3' may be a part of the source electrode S3 and a part of the drain electrode D3, respectively. Hereinafter, a source area and a drain area of a thin-film transistor may be used as including a source electrode and a drain electrode, respectively.

Figure 8:
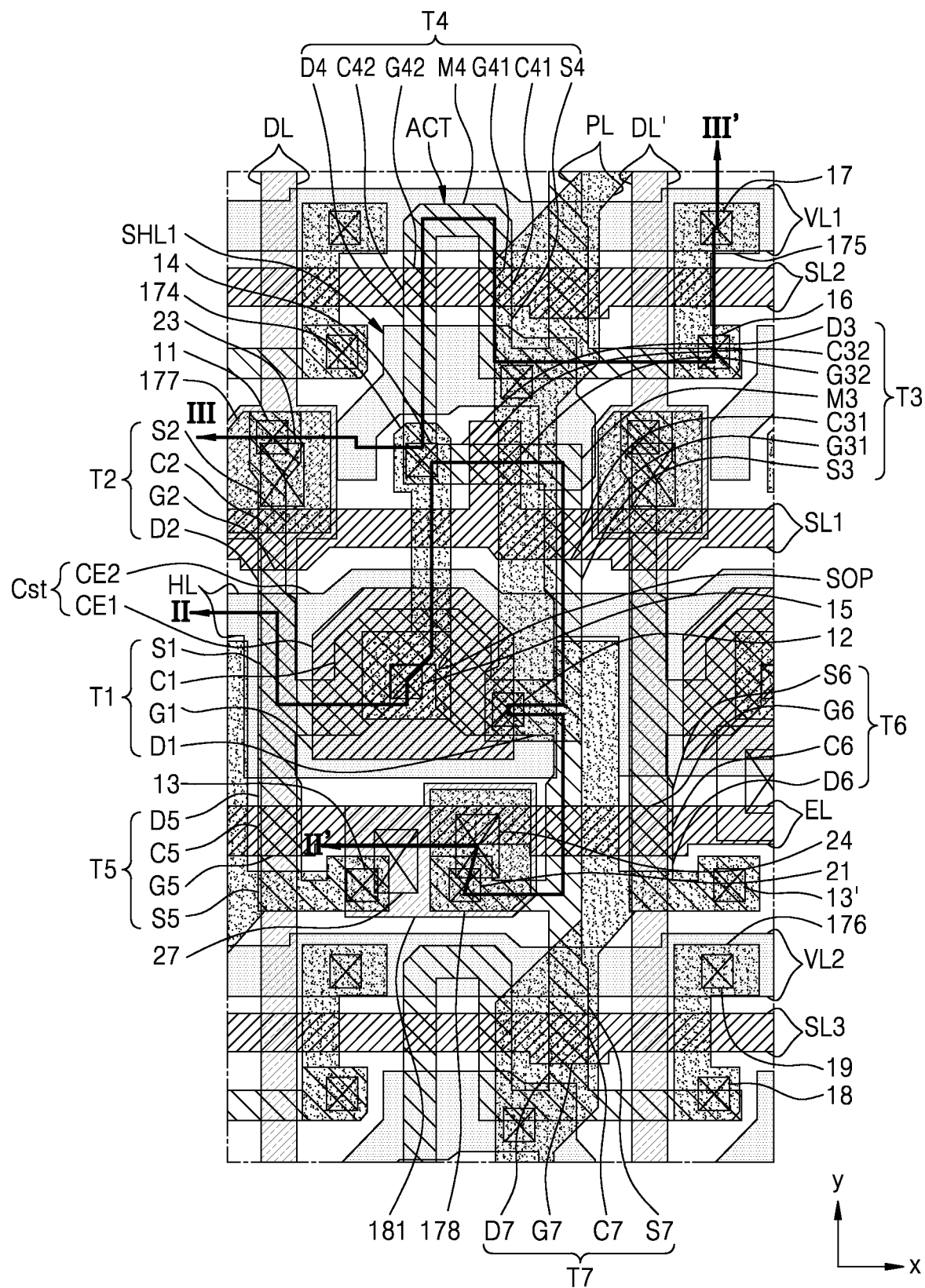
FIG. 8 is a layout diagram illustrating locations of a plurality of thin-film transistors and a capacitor arranged in pixel circuits of a display device according to an exemplary embodiment.
Figure 9A:
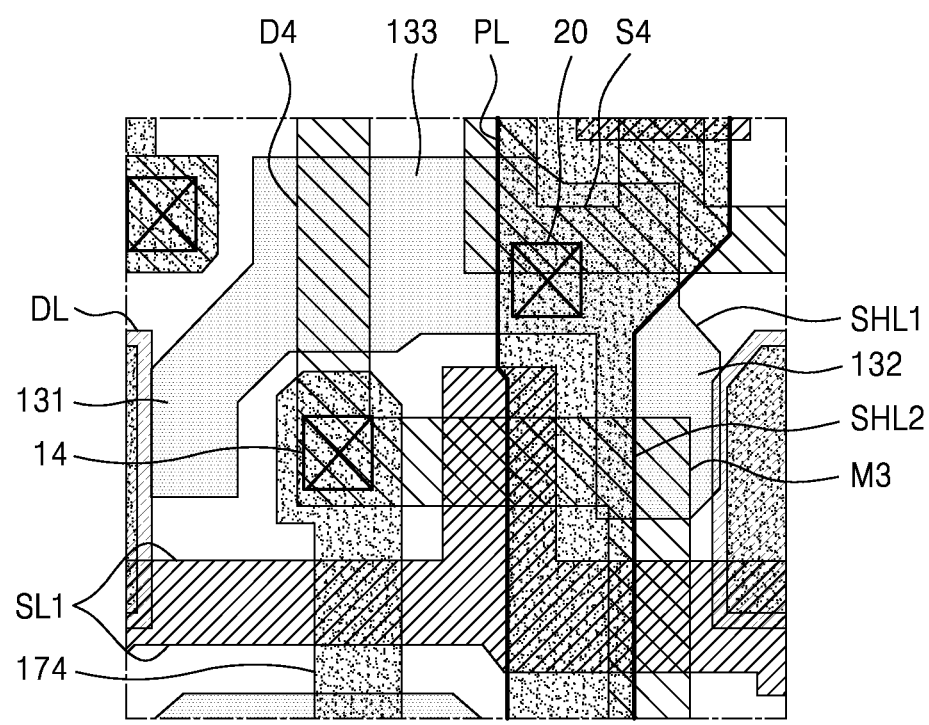
FIGS. 9A and 9B are enlarged views of a region including a third thin-film transistor of FIG. 8 according to an exemplary embodiment.
Figure 9B:
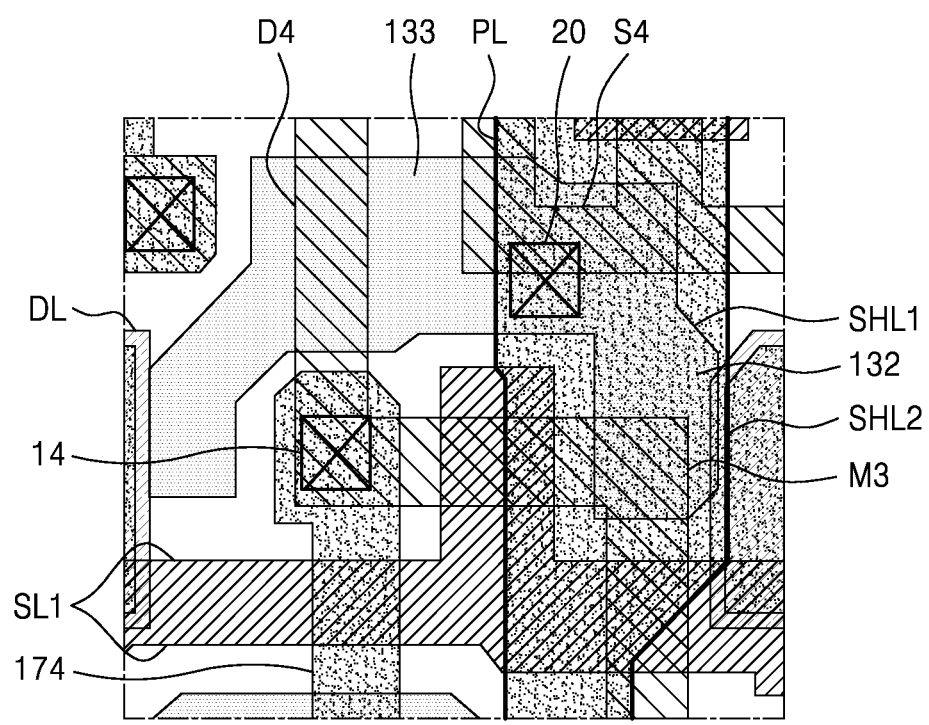
Figure 10:
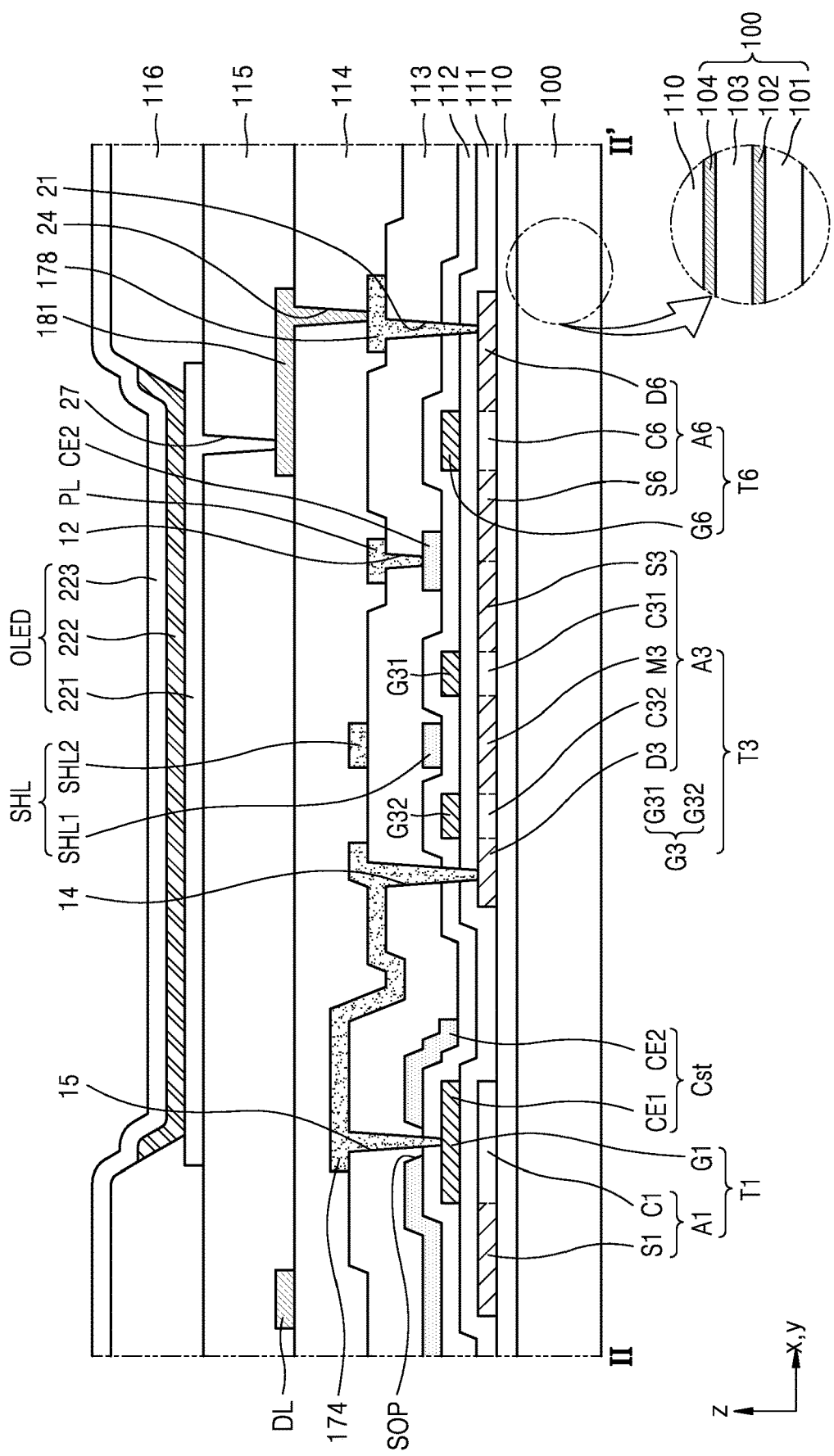
FIG. 10 is a schematic cross-sectional view of the display device cut along line II-II' of FIG. 8 according to an exemplary embodiment.
Figure 11:
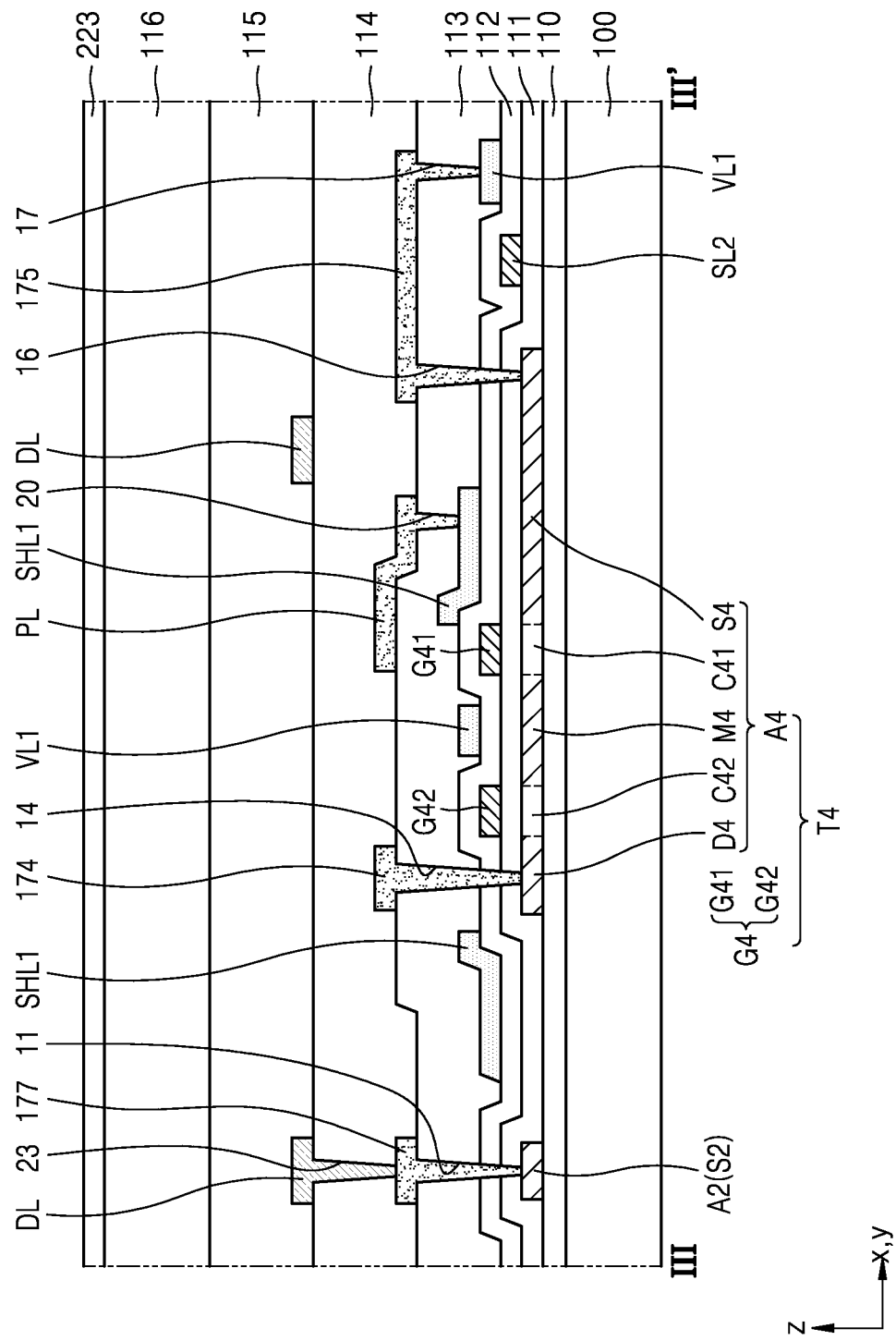
FIG. 11 is a schematic cross-sectional view of the display device cut along line III-III' of FIG. 8 according to an exemplary embodiment.

FIG. 8 is a layout diagram illustrating locations of a plurality of thin-film transistors and a capacitor arranged in pixel circuits of a display device according to an exemplary embodiment. FIGS. 9A and 9B are enlarged views of a region including a third thin-film transistor of FIG. 8. FIG. 10 is a schematic cross-sectional view of the display device cut along line II-II' of FIG. 8; and FIG. 11 is a schematic cross-sectional view of the display device cut along line III-III' of FIG. 8. The pixel circuit PC of FIG. 8 may be a pixel circuit shown in FIG. 6.

Referring to FIG. 8, a pixel circuit PC of a display device according to an exemplary embodiment may include a first scan line SL1, a second scan line SL2, a third scan line SL3, an emission control line EL, a first initialization voltage line VL1, and a second initialization voltage line VL2, which extend in the x-direction, and may include the data line DL and the power supply voltage line PL, which extend in the y-direction crossing the x-direction.

Also, the pixel circuit PC may include a first transistor T1, a second transistor T2, a third transistor T3, a fourth transistor T4, a fifth transistor T5, a sixth transistor T6, a seventh transistor T7, and a capacitor Cst. The first transistor T1, the second transistor T2, the third transistor T3, the fourth transistor T4, the fifth transistor T5, the sixth transistor T6, and the seventh transistor T7 may be implemented with thin-film transistors. Hereinafter, the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 will be described.

The first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 may be arranged along a semiconductor layer ACT, and partial regions of the semiconductor layer ACT may include semiconductor layers of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7.

Hereinafter, this will be described with reference to FIGS. 10 and 11.

The semiconductor layer ACT may be formed on the substrate 100. In an exemplary embodiment, a buffer layer 110 may be formed on the substrate 100, and the semiconductor layer ACT may be formed on the buffer layer 110.

The substrate 100 may include a glass material, a ceramic material, a metal material, or a flexible or bendable material. When the substrate 100 is flexible or bendable, the substrate 100 may include polymer resin, such as polyethersulphone (PES), polyacrylate, polyetherimide polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a multi-layer structure. For example, the substrate 100 may include a first base layer 101, a first barrier layer 102, a second base layer 103, and a second barrier layer 104, as shown in the enlarged view of FIG. 10.

The first base layer 101 and the second base layer 103 may include the above-described polymer resin. The first barrier layer 102 and the second barrier layer 104 that are layers for preventing penetration of external foreign substances may have a single layer or multi-layer structure including an inorganic material, such as silicon nitride (SiNx) and silicon oxide (SiOx).

The buffer layer 110 may be disposed on a top surface of the substrate 100 to provide a planarized surface. The buffer layer 110 may include an oxide layer such as silicon oxide (SiOx) and/or a nitride layer such as silicon nitride (SiNx), or silicon oxynitride (SiON).

The semiconductor layer ACT may include low temperature poly-silicon (LTPS). The poly-silicon material has high electron mobility (100 $cm^2$/Vs or higher), low energy consumption power, and excellent reliability. In an exemplary embodiment, the semiconductor layer ACT may include amorphous silicon (a-Si) and/or oxide semiconductor. Partial semiconductor layers of a plurality of thin-film transistors may be formed of LTPS, and the other semiconductor layers thereof may include a-Si and/or oxide semiconductor.

The semiconductor layer ACT of each of the first through seventh thin-film transistors T1 through T7 may include a source area, a drain area, and a channel area between the source area and the drain area. In an exemplary embodiment, each of the first through seventh thin-film transistors T1 through T7 may be formed a respective portion of the semiconductor layer ACT. The source area and the drain area may be a doped area in the vicinity of the channel area. Locations of the source area and the drain area may be reversed according to an exemplary embodiment. In an exemplary embodiment, the source area and the drain area may also serve as a source electrode and a drain electrode of the thin-film transistor.

A first gate insulating layer 111 may be located on the semiconductor layer ACT, and the gate electrode G1 of the first transistor T1, the first scan line SL1, the second scan line SL2, the third scan line SL3, and the emission control line EL may be located on the first gate insulating layer 111.

The first gate insulating layer 111 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$)

A gate electrode G2 of the second thin-film transistor T2 and gate electrodes G31 and G32 of the third thin-film transistor T3 may be portions of the first scan line 121 or protruding portions of the first scan line SL1 that cross channel areas of the second thin-film transistor T2 and the third thin-film transistor T3. Gate electrodes G41 and G42 of the fourth thin-film transistor T4 may be portions of the second scan line SL2 or protruding portions of the second scan line SL2 that crosses a semiconductor layer or portions. A gate electrode G7 of the seventh thin-film transistor T7 may be a portion of the third scan line SL3 that crosses the semiconductor layer. A gate electrode G5 of the fifth thin-film transistor T5 and a gate electrode G6 of the sixth thin-film transistor T6 may be portions of the emission control line EL or protruding portions of the emission control line EL that cross the semiconductor layer or portions. The gate electrode G1 of the first thin-film transistor T1 may be provided as an island type.

A second gate insulating layer 112 may be provided on the first scan line SL1, the second scan line SL2, the third scan line SL3, and the emission control line EL. The second gate insulating layer 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The electrode voltage line HL, the first initialization voltage line VL1, and the second initialization voltage line VL2 may be arranged on the second gate insulating layer 112.

The electrode voltage line HL may cover at least a part of the gate electrode G1 of the first thin-film transistor T1 and may be configured to form a capacitor Cst with the gate electrode G1 of the first thin-film transistor T1. A lower electrode CE1 of the capacitor Cst may be formed as a single body with the gate electrode G1 of the first thin-film transistor T1. For example, the gate electrode G1 of the first thin-film transistor T1 may function as the lower electrode CE1 of the capacitor Cst. A region that overlaps the gate electrode G1 of the first thin-film transistor T1 in the electrode voltage line HL may be an upper electrode CE2 of the capacitor Cst. Thus, the second gate insulating layer 112 may function as a dielectric layer of the capacitor Cst. An opening SOP may be formed in the upper electrode CE2 of the capacitor Cst. A node electrode 174 may be configured to electrically connect the lower electrode CE1 of the capacitor Cst to the drain area D3 of the third thin-film transistor T3 through the opening SOP. For example, the node electrode 174 includes a portion extending through the interlayer insulating layer 113 and the second gate insulating layer 112 to be in contact with the gate electrode G1. The portion of the node electrode 174 extends through the upper electrode CE2 via the opening SOP without being in contact with the upper electrode CE2.

The first initialization voltage line VL1 may include a portion that overlaps a middle area M4 of the fourth thin-film transistor T4. For example, the portion of the first initialization voltage line VL1 that overlaps the middle area M4 of the fourth thin-film transistor T4 may function as a shielding layer.

The second initialization voltage line VL2 may be between the emission control line EL and the third scan line SL3 in a plane view.

The first shielding layer SHL1 may be located on the second gate insulating layer 112. Part of the first shielding layer SHL1 may overlap the middle area M3 of the third thin-film transistor T3. Also, the first shielding layer SHL1 may overlap the drain area D4 and the source area S4 of the fourth thin-film transistor T4.

The first shielding layer SHL1, the electrode voltage line HL, the first initialization voltage line VL1, and the second initialization voltage line VL2 may have a single layer or multi-layer structure including one or more materials from among Al, Pt, Pd, Ag, Mg, Au, Ni, Nd, Ir, Cr, Li, Ca, Mo, Ti, W, and Cu.

An interlayer insulating layer 113 is located on the first shielding layer SHL1, the electrode voltage line HL, the first initialization voltage line VL1, and the second initialization voltage line VL2. The interlayer insulating layer 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The power supply voltage line PL, the node electrode 174, first and second connection lines 175 and 176, and first and second connection electrodes 177 and 178 may be located on the interlayer insulating layer 113. The power supply voltage line PL, the node electrode 174, the first and second connection lines 175 and 176, and the first and second connection electrodes 177 and 178 may include conductive materials including Mo, Al, Cu, or Ti, and may have a multi-layer or single layer structure including the above-described materials. For example, the power supply voltage line PL, the node electrode 174, the first and second connection lines 175 and 176, and the first and second connection electrodes 177 and 178 may have a multi-layer structure including Ti/Al/Ti.

The power supply voltage line PL may be between the data line DL and a data line DL' of a pixel circuit adjacent to the right side in a plane view. The power supply voltage line PL may be electrically connected to the upper electrode CE2 of the capacitor Cst through a contact hole 12 formed in the interlayer insulating layer 113. Thus, the electrode voltage line HL may have the same voltage level (constant voltage) as the power supply voltage line PL. A portion of the power supply voltage line PL that protrudes and extends in the x-direction may be electrically connected to a drain area D5 of a fifth thin-film transistor of the pixel circuit adjacent to the right side through a contact hole 13'. For example, the drain area D5 of the fifth thin-film transistor of the pixel circuit PC shown in FIG. 8 may be electrically connected to a portion that protrudes and extends from a driving voltage line of a pixel circuit adjacent to the left side in the x-direction through the contact hole 13. Part of the power supply voltage line PL may overlap at least part of the middle area M3 of the third thin-film transistor.

As shown in FIGS. 9A and 10, the power supply voltage line PL may include a second shielding layer SHL2 that overlaps part of the first shielding layer SHL1 overlapping the middle area M3 of the third thin-film transistor. For example, the second shielding layer SHL2 may be part of the power supply voltage line PL. The power supply voltage line PL may be electrically connected to the first shielding layer SHL1 through a contact hole 20 as shown in FIG. 9A. For example, the first shielding layer SHL1 and the second shielding layer SHL2 may receive a constant voltage from the power supply voltage line PL.

A first portion 131 of the first shielding layer SHL1 may be between the data line DL and the node electrode 174 in a plane view and may shield coupling between the data line DL and the node electrode 174. A second portion 132 of the first shielding layer SHL1 may overlap the middle area M3 of the third thin-film transistor T3 and may shield the semiconductor layer A3 of the third thin-film transistor T3 from external light. The first shielding layer SHL1 may include a third portion 133 between the first portion 131 and the second portion 132. The third portion 133 of the first shielding layer SHL1 may overlap the source area S4 and the drain area D4 of the fourth thin-film transistor T4.

In FIG. 9A, the second portion 132 of the first shielding layer SHL1 may partially overlap the middle area M3 of the third thin-film transistor T3. And the second shielding layer SHL2 may overlap a portion of the middle area M3 of the third thin-film transistor T3, that is not overlapped by the second portion 132 of the first shielding layer SHL1. The second shielding layer SHL2 may partially overlap the second portion 132 of the first shielding layer SHL1 and the third portion of the first shielding layer SHL1. In an exemplary embodiment, as shown in FIG. 9B, the second shielding layer SHL2 may entirely cover the middle area M3 of the third thin-film transistor T3 and the second portion 132 of the first shielding layer SHL1.

One end of the node electrode 174 may be electrically connected to the drain area D3 of the third thin-film transistor T3 and the drain area D4 of the fourth thin-film transistor T4 through a contact hole 14, and the other end of the node electrode 174 may be electrically connected to the gate electrode G1 of the first thin-film transistor T1 through a contact hole 15. The contact hole 15 may overlap the opening SOP formed in the upper electrode CE2 of the capacitor Cst.

One end of the first connection line 175 may be electrically connected to the source area S4 of the fourth thin-film transistor T4 through a contact hole 16, and the other end of the first connection line 175 may be electrically connected to the first initialization voltage line VL1 through a contact hole 17.

One end of the second connection line 176 may be electrically connected to a drain area D7 of a seventh thin-film transistor T7 through a contact hole 18, and the other end of the second connection line 176 may be electrically connected to the second initialization voltage line VL2 through a contact hole 19. The same constant voltage (for example, −2V) may be applied to the first initialization voltage line VL1 and the second initialization voltage line VL2.

The first connection electrode 177 may be electrically connected to the source area S2 of the second thin-film transistor T2 through a contact hole 11.

The second connection electrode 178 may be electrically connected to a drain area D6 of a sixth thin-film transistor T6 through a contact hole 21.

A first planarization layer 114 may be located on the power supply voltage line PL, the node electrode 174, the first and second connection lines 175 and 176, the first and second connection electrodes 177 and 178. The data line DL and a third connection electrode 181 may be located on the first planarization layer 114.

The data line DL may be electrically connected to the first connection electrode 177 through a contact hole 23, thereby being electrically connected to the source area S2 of the second thin-film transistor T2.

The third connection line 181 may be electrically connected to the second connection line 178 through a contact hole 24, thereby being electrically connected to the drain area D6 of the sixth thin-film transistor T6. The third connection electrode 181 may be electrically connected to a pixel electrode 221 through a contact hole 27.

Although not shown, as shown in FIG. 7B, a third shielding layer that is located on the same layer as the data line DL and has at least a part thereof overlapping the middle area M3 of the third thin-film transistor T3. At least a part of the third shielding layer may overlap the first shielding layer SHL1 and/or the second shielding layer SHL2.

A second planarization layer 115 may be located on the data line DL and the third connection electrode 181, and an organic light-emitting diode OLED may be located on the second planarization layer 115.

The first planarization layer 114 and the second planarization layer 115 may have a flat top surface so that the pixel electrode 221 may be flatly formed. The first planarization layer 114 and the second planarization layer 115 may have a single layer or multi-layer structure including organic materials. The first planarization layer 114 and the second planarization layer 115 may include general-purpose polymer such as benzocyclobutene (BCB), polyimide, hexamethyldisiloxane (HMDSO), polymethylmethacrylate (PXMMA), or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

In an exemplary embodiment, the first planarization layer 114 and the second planarization layer 115 may include inorganic materials. The first planarization layer 114 and the second planarization layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the first planarization layer 114 and the second planarization layer 115 include inorganic materials, chemical planarization polishing may be performed to form the first planarization layer 114 and the second planarization layer 115. In an exemplary embodiment, the first planarization layer 114 and the second planarization layer 115 may include both organic materials and inorganic materials.

A pixel-defining layer 116 may be located on the second planarization layer 115. The pixel-defining layer 116 may have an opening for exposing part of the pixel electrode 221, thereby defining an emission area of a pixel. Also, the pixel-defining layer 116 may increase a distance between edges of the pixel electrode 221 and an opposite electrode 223, thereby preventing an arc discharge from occurring in the edges of the pixel electrode 221. The pixel-defining layer 116 may include organic insulating materials, such as polyimide, polyamide, acryl resin, BCB, HMDSO, and phenol resin.

The organic light-emitting diode OLED may include the pixel electrode 221, an intermediate layer 222, and the opposite electrode 223. The organic light-emitting diode OLED is the same as a description with reference to FIG. 4. The planarization layer PNL of FIG. 4 may be a second planarization layer 115 of FIG. 10. The intermediate layer 222, as described with reference to FIG. 4, includes an emission layer 222b, a first functional layer 222a and/or a second functional layer 222c. The opposite electrode 223 may be formed as a single body so as to correspond to a plurality of pixel electrodes 221.

The first initialization voltage line VL1, the second scan line SL2, the second initialization voltage line VL2, and the third scan line SL3 may be shared in two pixel circuits that are adjacent to each other in the y-direction.

For example, the first initialization voltage line VL1 and the second initialization voltage line SL2 may be electrically connected to a seventh thin-film transistor of a neighboring pixel circuit located on an upper portion of the pixel circuit PC as shown in FIG. 8 in the y-direction. Thus, the seventh thin-film transistor of the neighboring pixel circuit may receive the previous scan signal applied to the second scan line SL2 as a scan signal and may receive an initialization voltage from the first initialization voltage line VL1. Similarly, the second initialization voltage line VL2 and the third scan line SL3 may be electrically connected to a fourth thin-film transistor of the neighboring pixel circuit located on a lower portion of the pixel circuit PC as shown in FIG. 8 in the y-direction and thus may receive a scan signal applied to the third scan line SL3 as the previous scan signal and may receive an initialization voltage from the second initialization voltage line VL2.

Although not shown, a thin-film encapsulation layer (not shown) or a sealing substrate (not shown) may be located on the opposite electrode 223, thereby covering the organic light-emitting diode OLED to protect the organic light-emitting diode OLED. The thin-film encapsulation layer (not shown) may cover the display area DA and may extend outside the display area DA. The thin-film encapsulation layer may include at least one inorganic encapsulation layer including an inorganic material and at least one organic encapsulation layer including an organic material. In some exemplary embodiments, the thin-film encapsulation layer may have a stacked structure of a first inorganic encapsulation layer/organic encapsulation layer/second inorganic encapsulation layer. The sealing substrate (not shown) may be spaced apart from the substrate 100 and may be joined to the substrate 100 using a sealing member, such as a sealant or frit, in the peripheral area PA.

Also, a spacer for preventing mask stamping may be further included on the pixel-defining layer 116.

In FIG. 8, a dual shielding layer including the first shielding layer SHL1 and the second shielding layer SHL2 may be located to overlap the middle area M3 of the third thin-film transistor T3, and the first initialization voltage line VL1 may be located as a single shielding layer to overlap the middle area M4 of the fourth thin-film transistor T4. In an exemplary embodiment, a shielding layer (e.g., the second shield layer SHL2 in FIG. 10) on the interlayer insulating layer 113 and/or a shielding layer (e.g., the third shield layer SHL3 of FIG. 7B) on the first planarization layer 114 may be further located to overlap the middle area M4 of the fourth thin-film transistor T4. The shielding layer on the interlayer insulating layer 113 and the power supply voltage line PL may include the same material and may be positioned on the same layer. The shielding layer on the first planarization layer 114 and the data line DL may include the same material and may be positioned on the same layer.

In FIGS. 8, 10, and 11, the data line DL may be located on the first planarization layer 114 and may be electrically connected to the source area S2 of the second thin-film transistor T2 through the first connection electrode 177. The power supply voltage line PL may be located on the interlayer insulating layer 113. The present invention is not limited thereto. In an exemplary embodiment, the data line DL and the power supply voltage line PL may be located on the same layer. In this case, the power supply voltage line PL may be located so that the data line DL and the power supply voltage line PL may be insulated from each other, and a second shielding layer that is a separate element from the power supply voltage line PL may be provided as an island type. The power supply voltage line PL may be electrically connected to the first shielding layer SHL1, and the second shielding layer of the island type may be electrically connected to the first shielding layer SHL1. The second shielding layer and the power supply voltage line PL may include the same material and may be disposed on the same layer (e.g., the first planarization layer 114) or the second shielding layer and the third connection electrode 181 may include the same material and may be disposed on the same layer (e.g., the first planarization layer 114).

In a display device according to one or more embodiments, external effects of a thin-film transistor in a pixel may be minimized so that high-quality images may be provided. The scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
  a thin-film transistor including a semiconductor layer, a first gate electrode and a second gate electrode, wherein the first and second gate electrodes overlap the semiconductor layer in a plan view;
  a first shielding layer overlapping a portion of the semiconductor layer between the first gate electrode and the second gate electrode, in a plan view;
  a capacitor including a first electrode and a second electrode overlapping the first electrode; and
  a scan line connected to the thin-film transistor, the scan line extending in a first direction and disposed in a space between the first shielding layer and the second electrode of the capacitor, in a plan view.

2. The display device of claim 1, further comprising a second shielding layer overlapping the first shielding layer.

3. The display device of claim 2, wherein the second shielding layer extends in a second direction perpendicular to the first direction and overlaps the second electrode of the capacitor.

4. The display device of claim 3, further comprising a first voltage line extending in the second direction, the first voltage line including the second shielding layer.

5. The display device of claim 4, wherein the second shielding layer is connected to the first shielding layer.

6. The display device of claim 1, further comprising a first voltage line extending in a second direction perpendicular to the first direction, and
  wherein a voltage applied to the first shielding layer and a voltage applied to the first voltage line are the same.

7. The display device of claim 1, wherein the first shielding layer receives a constant voltage.

8. The display device of claim 1, wherein the first gate electrode and the second gate electrode are on a same layer.

9. The display device of claim 1, further comprising:
  a driving thin-film transistor;
  a node electrode connected to a gate electrode of the driving thin-film transistor and the semiconductor layer of the thin-film transistor; and
  a data line extending in a second direction perpendicular to the first direction, and
  wherein the first shielding layer is disposed between the data line and the node electrode.

10. The display device of claim 9, further comprising a second thin-film transistor connected between the gate electrode of the driving thin-film transistor and a second voltage line, and wherein the second thin-film transistor includes a second semiconductor layer, a first gate electrode and a second gate electrode, and
  wherein the second voltage line overlaps a portion of the second semiconductor layer between a first overlapping portion and a second overlapping portion of the second semiconductor layer and another scan line, in a plan view.

11. A display device comprising:
  a first thin-film transistor including a first semiconductor layer;
  a first scan line extending in a first direction and overlapping the first semiconductor layer twice;
  a first shielding layer overlapping a portion of the first semiconductor layer between a first overlapping portion and a second overlapping portion of the first semiconductor layer and the first scan line, in a plan view; and
  a second shielding layer overlapping the first shielding layer.

12. The display device of claim 11, further comprising:
a second thin-film transistor including a second semiconductor layer; and
a second scan line extending in the first direction and overlapping the second semiconductor layer, and
wherein the first shielding layer is disposed between the first scan line and the second scan line, in a plan view.

13. The display device of claim 12, wherein the second semiconductor layer of the second thin-film transistor is connected to a first voltage line, and
wherein the first voltage line overlaps a portion of the second semiconductor layer between a first overlapping portion and a second overlapping portion of the second semiconductor layer and the second scan line, in a plan view.

14. The display device of claim 13, wherein the first shielding layer overlaps a portion of the second semiconductor layer between the second overlapping portion and a third overlapping portion of the second semiconductor layer and the second scan line, in a plan view.

15. The display device of claim 11, wherein the second shielding layer is connected to the first shielding layer.

16. The display device of claim 11, wherein a voltage applied to the first shielding layer and a voltage applied to the second shielding layer are the same.

17. The display device of claim 11, further comprising:
a driving thin-film transistor;
a node electrode connected to a gate electrode of the driving thin-film transistor and the first semiconductor layer of the first thin-film transistor; and
a data line extending in a second direction perpendicular to the first direction, and
wherein the first shielding layer is disposed between the data line and the node electrode.

18. The display device of claim 17, further comprising a capacitor including a first electrode and a second electrode overlapping the first electrode, and
wherein the first shielding layer and the second electrode of the capacitor are disposed on a same layer.

19. The display device of claim 18, wherein the first electrode of the capacitor includes the gate electrode of the driving thin-film transistor.

20. The display device of claim 18, further comprising a second voltage line extending in the second direction and overlapping the second electrode of the capacitor.

* * * * *